United States Patent [19]
Becker et al.

[11] Patent Number: 4,588,949
[45] Date of Patent: May 13, 1986

[54] METER REMOVAL INDICATOR

[75] Inventors: Dale F. Becker; Norman B. Venaas, both of Seneca, S.C.

[73] Assignee: Sangamo Weston, Inc., Norcross, Ga.

[21] Appl. No.: 532,888

[22] Filed: Sep. 16, 1983

[51] Int. Cl.[4] .................... G01R 11/24; G08B 13/06; G09F 9/00
[52] U.S. Cl. .................................. 324/110; 116/307; 340/568
[58] Field of Search ............... 324/110, 156; 340/568, 340/571, 637, 687; 361/364, 369, 370, 371; 116/307, 313

[56] References Cited

U.S. PATENT DOCUMENTS

| | | | |
|---|---|---|---|
| 4,150,371 | 4/1979 | Scaglione | 340/637 |
| 4,175,813 | 11/1979 | Mentesana | 324/110 |
| 4,386,313 | 5/1983 | Venaas et al. | 324/110 |
| 4,386,314 | 5/1983 | Becker | 324/110 |
| 4,514,683 | 4/1985 | Deibert et al. | 324/110 |

FOREIGN PATENT DOCUMENTS 492979 10/1927 Fed. Rep. of Germany .
941080 4/1956 Fed. Rep. of Germany .

Primary Examiner—Ernest F. Karlsen
Attorney, Agent, or Firm—Dale Gaudier

[57] ABSTRACT

Electricity meter fraud is detected by incorporating a unidirectional cyclometer-type register into a meter. The register is actuated each time the meter and cover assembly (which is factory sealed) is removed from its associated socket by an actuating arm assembly which is in contact with the socket. In one embodiment the actuating arm includes a rod which protrudes through an opening formed in the base of the meter and is biased into contact with the socket so that when the meter is removed from the socket the register is actuated. Alternatively, the actuating arm is connected to a sliding-type meter terminal which is actuated upon insertion and/or removal of the meter base with respect to the socket. In a further arrangement, a switch is provided in the base of the meter and is arranged to energize a solenoid to actuate the register whenever the meter is removed from its socket. The register can include one or more drums, with the drums each having a plurality of markings provided thereon, such as the digits 0-9, indicative of the position of the drum. Upon the removal of the meter from its socket the register is actuated causing different markings to be displayed. The register drum is designed to rotate in only one direction and jams upon reaching a predetermined position so that the markings originally displayed by the register cannot be brought back into view by a person who has fraudulently removed the meter from its socket.

21 Claims, 6 Drawing Figures

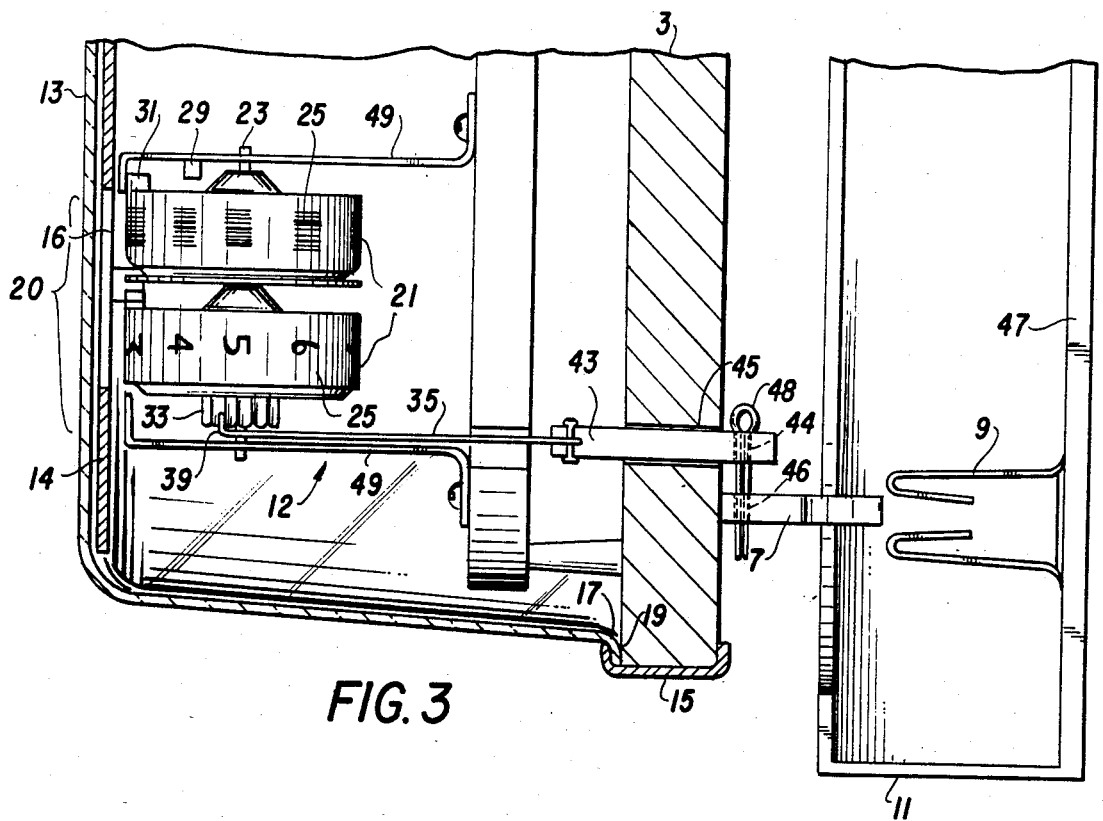

METER REMOVAL INDICATOR

BACKGROUND OF THE INVENTION

The invention relates to the field of tamper detecting devices for electricity, gas, or water meters or the like, and more particularly to an arrangement for detecting removal of such a meter from its socket and giving an indication thereof which is relatively immune to being bypassed or subverted.

Various techniques have been used to prevent and/or detect tampering with a meter that measures a billable quantity such as electricity, gas or water. These techniques generally take the form of either special locks or seals for preventing removal of the metering apparatus from its associated socket, or devices for visually indicating that the meter has been removed or replaced in its socket.

Exemplary of this latter category are various types of warning flags, lights or other visual indicators which are actuated upon the removal or reinsertion of the meter from its socket. Such arrangements are shown, for example, in U.S. Pat. Nos. 4,386,313 and 4,386,314. It is also known to optically encode a warning flag using a so-called "bar code" as shown in copending U.S. Patent Application Ser. No. 489,895, filed Apr. 29, 1983, entitled "Optically Encoded Tampering Indicator for Display Register" and assigned to the same assignee as the present application. As disclosed by this application, the bar coding of a tamper indicating flag enables automatic remote optical detection of the flag to be performed by the meter reader or inspector using a commercially available laser scanner.

However, the above arrangements suffer from the disadvantage of requiring fairly complex actuating mechanisms which, once their method of operation is known, can be bypassed or subverted by relatively simple means.

It is therefore a primary object of the present invention to provide a simple and economical arrangement for indicating if a metering apparatus has been moved relative to its socket, and which is highly immune to either physical or electronic subversion.

SUMMARY OF THE INVENTION

The present invention, in its broadest aspect, comprises means for detecting movement of a measuring apparatus, such as an electricity, water or gas meter, relative to its socket, the detecting means comprising a unidirectional register mounted to the measuring apparatus, with the register capable of displaying at least one of a plurality of markings and arranged to be no longer operative upon displaying a predetermined one of the markings. The detecting means further includes means for actuating the register having a first portion connected to the register and a second portion engaging the socket, the actuating means being responsive to the movement of the measuring apparatus relative to the socket so as to cause the displayed register markings to change to thereby give an indication of such movement.

Preferably, the register is a cyclometer-type register or counter having one or more rotatable drums with visually perceptible markings placed thereon. The visually perceptible markings can be the digits 0-9, other alphanumeric characters, or other visually perceptible markings, such as bar code markings indicative of the particular position of the drum. The mechanical register includes a one-way ratcheting mechanism to insure that the register drum rotates in only a single direction.

In a first embodiment, the register is actuated by means of an arm having one end engaging the one-way ratcheting mechanism, and the other end of the arm connected to a rod having one end directed through an opening provided in the base of the meter apparatus. The arm is biased, such as by a spring, to cause the rod to normally protrude a predetermined distance through the opening in the base. When the base of the metering apparatus is placed in contact with the socket, the actuator arm and rod are forced toward the register causing the ratcheting mechanism to be actuated and the register drum to be rotated to display a new marking. This causes the register drum to be moved or indexed to its next position and thus display a different marking than before and acts as an indication to the meter reader or inspector that the meter has been moved relative to its base.

The end of the rod which protrudes through the base is provided with an opening proximate the base into which a pin can be inserted to prevent movement of the rod to thus temporarily disable the actuating mechanism so that the meter can be tested prior to insertion at its intended location without actuating the register. The particular markings displayed by the one or more register drums are then recorded either manually, or using an optical scanner where bar coding is utilized. Upon subsequent inspections of the meter, any change in the markings displayed by the register drum will indicate that the meter has been tampered with.

In a second embodiment, the register is actuated by means of an arm or rod having one end engaging the ratcheting mechanism and the other end connected to a male-type terminal slidingly fitted into the base of the meter. When the base of the meter is fitted to its associated socket the male terminal engages a corresponding female-type receptacle provided on the socket. Since a certain amount of friction is present between the female receptacle and the sliding male terminal, when the base of the meter is moved into contact with the socket the sliding terminal will also move slightly, thus causing the arm to move and actuate the ratcheting mechanism of the register.

In order to allow a utility to test the meter without actuating the register an opening is provided in the male terminal proximate the base of the meter into which a pin can be inserted. When inserted, the pin prevents movement of the sliding terminal and acts to disable the register actuating means. Before the meter is put into service the pin is removed and the meter is inserted into its socket.

In either of the above embodiments the actuating mechanism can be arranged to rotate the register drum when the base of the meter is either moved away from or toward the socket. Also, in either of the above embodiments the actuating mechanism can also be arranged to rotate the register drum halfway between markings upon the removal of the base from the socket and to move the register drum fully to its next position upon reinsertion of the base to the socket.

In a third embodiment of the invention, the register and one-way ratcheting mechanism are connected by means of an arm or rod or other such linking means attached to the movable armature of a solenoid. A normally open switch having a pair of contacts is disposed on the base of the meter facing the socket and is arranged such that when the meter is inserted into the socket the switch contacts are closed. The switch is in series with a source of power applied to the solenoid. When the contacts are closed the solenoid is energized and actuates the register drum to move it into its next position. Means, such as a insulating shim placed between the contacts of the switch, can be used to temporarily disable the operation of the solenoid driving mechanism. Alternatively, the solenoid can simply be energized by power derived from the socket so that the register is actuated whenever the base is made to contact the socket.

A chief advantage of the above-described arrangements is that they can be readily retrofitted onto existing types of meters and, except for the solenoid driven version of the invention, do not require outside sources of power. In addition, since the register drum rotates in only one direction and jams or becomes inoperable at a predetermined position, an individual who removes the meter from its socket will not be able to repeatedly actuate the register mechanism in an attempt to bring the register drum back around to its originally displayed markings. Thus, the present invention not only gives an indication that the meter has been moved relative to its socket, but also is relatively secure against attempts to defeat or subvert the tamper indicating mechanism. Further anti-tampering features may include a protective enclosure around the register and actuator, and a cover which is sealed to the base of the meter to enclose the meter and register.

BRIEF DESCRIPTION OF THE DRAWING FIGURES

These and other features and advantages of the present invention will be understood from the following detailed description of the preferred embodiments, when taken in conjunction with the accompanying drawing figures wherein:

FIG. 3 is a partial top view of the arrangement shown in FIG. 2 taken along line A—A;

FIG. 4 is a partial top view of a second embodiment of the present invention;

DETAILED DESCRIPTION OF THE PREFERRED EMBODIMENTS

Figure 1:
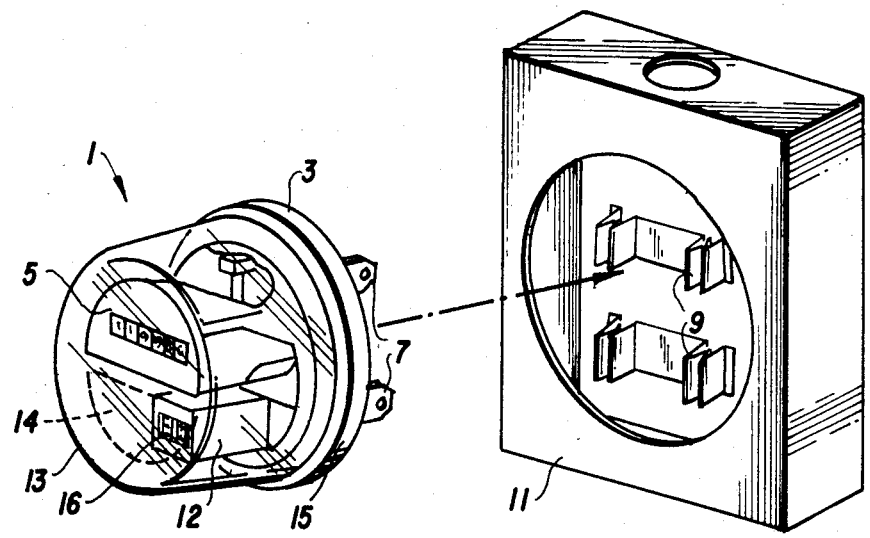
FIG. 1 is an overall perspective view of one type of metering apparatus and associated socket with which the present invention can be used.

Referring to FIG. 1, there is shown one type of metering apparatus with which the present invention can be used. By way of example, the metering apparatus 1 shown in FIG. 1 is a watthour meter for measuring electrical power consumption. However, it is understood that the principles of the present invention can be utilized with other types of measuring apparatus, such as water meters, gas meters, etc. that mount to a separate socket.

Measuring apparatus 1 includes a base 3 to which the metering components, shown generally at 5, are mounted. Base 3 includes one or more terminals 7 which are designed to engage one or more complementary receptacles 9 formed on a socket 11 when the base is moved into engagement with the socket. A tamper indicating mechanism, shown generally at 12, is mounted to metering apparatus 5 or base 3. As will be described with respect to FIGS. 2-5, the tamper indicating mechanism is designed to display a visual marking or markings, with the tamper indicating mechanism arranged such that movement of the meter base relative to the socket causes the displayed markings to be changed and in a fashion which makes it virtually impossible for an unauthorized user to reset to its originally displayed position.

Metering apparatus 1 further may include a cover 13 mounted to the base and enclosing the metering apparatus. If desired, the cover, which can be formed from glass or a clear plastic, can be sealed to the base by means of a U-shaped band 15 which is crimped into place over flanges 17 and 19 formed, respectively, as part of the cover and base at their point of contact (see FIG. 2). This sealing band serves to make it difficult for an unauthorized person to remove cover 13 from base 3 and thereby gain access to metering mechanism 5 and the tamper indicating mechanism. Metering apparatus 1 may also include a lower face plate 14, shown in outline in FIG. 1, which has an opening or window 16 for exposing the one or more visual markings diplayed by the tamper indicating mechanism, as discussed more fully below.

Figure 2:
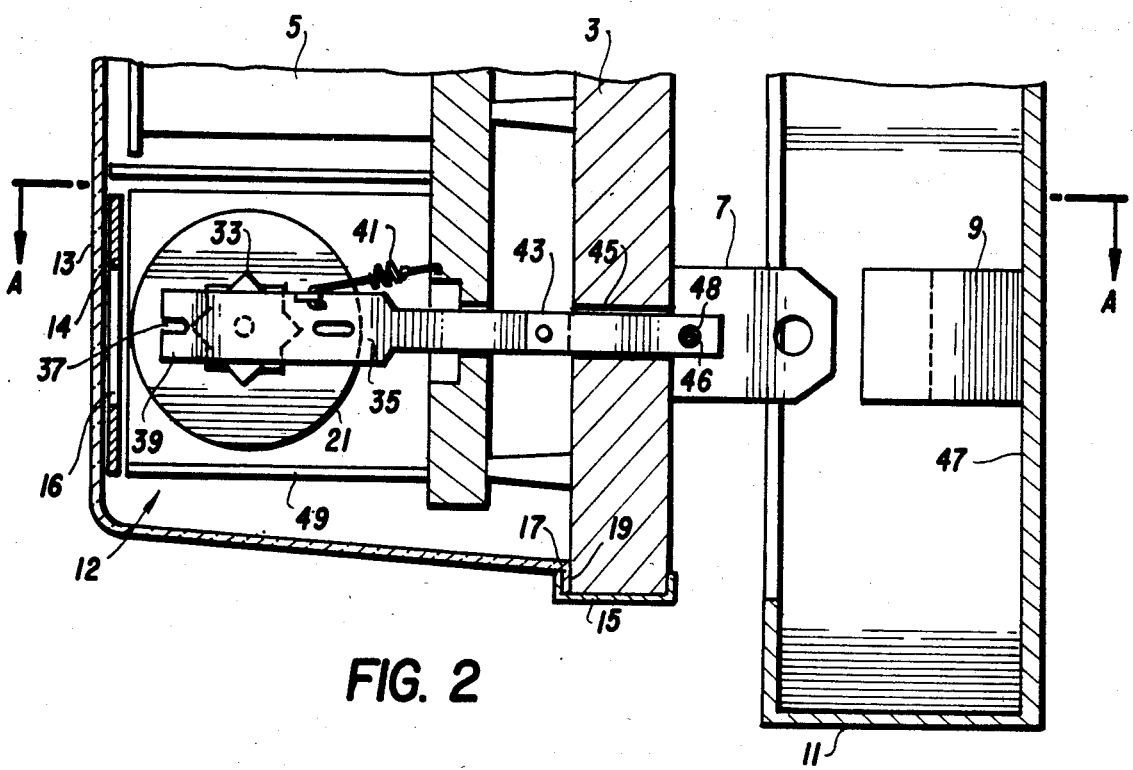
FIG. 2 is a partial side elevational view showing the details of a first embodiment of the present invention.

Turning now to the first embodiment of the invention, as shown in FIG. 2 tamper indicating mechanism 12 comprises a cyclometer-type register 20 or counter having one or more drums 21 mounted coaxially along a common axis 23 (see FIG. 3). Each drum has a plurality of markings 25, for example the numerals 0-9, alphanumeric characters, or other markings, such as bar code markings, formed thereon. One type of register which can be utilized is a decade counter capable of counting from 0-9, 0-99, etc., depending on the number of drums 21 provided. Such registers are commercially available from Veeder-Root, Inc. and include a one-way ratcheting mechanism which allows the register drums to rotate in only one direction. This is to prevent someone from attempting to reset a register drum back to a previous position simply by rotating the drum in a reverse direction from that in which it is normally driven. Register 20 further includes means, such as a pin or detent 29, which engages a complementary finger 31 formed as part of the register drum. The pin and finger cooperate to render the register inoperable (e.g. by causing it to jam) whenever the register reaches a certain predetermined position (e.g. upon displaying all "nines"). This prevents an unauthorized user from rotating a drum all the way around in order to bring a desired marking back into view in window 16 in an attempt to conceal tampering with the meter.

The one-way ratcheting mechanism comprises a toothed wheel or gear 33 formed coaxially with one of the register drums 21. An arm 35 has a detent 37 and a finger 39 formed on one end which cooperate with gear 33 to cause gear 33 and drum 21 to rotate unidirectionally (in this case counterclockwise as seen in FIG. 2) whenever arm 35 is moved toward base 3. Detent 37 and finger 39 are slightly biased into contact with gear 33 by means of spring 41. If two or more register drums 21 are used they are ganged together in conventional fashion.

As shown in FIGS. 2 and 3, one end of a rod 43 is connected to arm 35 of the one-way ratcheting mechanism. The second end of rod 43 protrudes through an opening 45 formed in the base of the meter. The amount of protrusion is selected so that the second end of the rod contacts the surface 47 of socket 11 directly when the base and socket are engaged. Alternatively, the second end of the rod can be arranged to contact one of the terminal receptacles 9 disposed on the socket.

By suitable arrangement of finger 39 and detent 37 the register drum can be caused to move to display the next set of markings in window 16 either upon the insertion or removal of the meter base from its socket. Alternatively, by changing the number of teeth on gear 33 the one-way ratcheting mechanism can be arranged to index the register drum only halfway between markings upon the occurrence of either a removal or its reinsertion of the meter base to its socket. With this arrangement, the next set of markings will be displayed in window 16 only upon one complete removal/reinsertion cycle having been completed.

Openings 44 and 46, formed respectively in the protruding portion of rod 43 and terminal 7 proximate base 3, are provided so that a pin 48 may be inserted to prevent movement of rod 43 and to thus temporarily disable actuation of the register. This arrangement is useful, for example, when it is necessary to insert the meter into the socket for testing purposes without actuating the tamper indicating mechanism.

Tamper indicating mechanism 12 can be placed within an enclosure 49 making it relatively difficult for an unauthorized user to tamper with any of the internal workings of the mechanism. In addition, it will be appreciated that someone who does attempt to tamper with the register will be unable to rotate the register drums in a reverse direction (since the one-way ratcheting mechanism prevents such movement) and will also be unable to rotate the register drums through one full turn in order to display the original markings which was displayed before any tampering had occurred. Thus, short of completely removing tamper indicating mechanism 12 (which by itself would also be an indication of tampering) any removal or reinsertion of the base of the metering apparatus with respect to the socket will cause an irreversible change in the markings 25 displayed in window 16. Also, if bar coding is used in conjunction with other markings, or in place thereof, the position of the register drums can be automatically and remotely detected using a commercially available laser scanner such as that manufactured by Symbol Technologies, Inc., Hauppauge, N.Y. As will be recognized, such a scanner can be arranged to emit a warning signal to its operator if the bar code markings scanned through window 16 are not those previously recorded.

FIG. 4 shows an alternative embodiment of the invention which utilizes many of the same components as described above with respect to FIGS. 2 and 3 but which uses a slightly different arrangement for actuating the register.

Rather than extending the second end of the actuating rod through an opening in the base of the meter apparatus as shown in FIGS. 2 and 3, arm 35 is attached to one end of a male terminal 51 which is slidingly received in a slot provided therefor in base 3. The sliding terminal is thus constrained to move in a direction generally perpendicular to the plane of the base. Arm 35 is connected to the sliding terminal by a suitable connecting means, such as a pin 53 which is fitted through an opening formed in the arm and in the end of the sliding terminal closest to the register.

It will be appreciated that when male terminal 51 is moved into contact with the jaws of a complementary female receptacle 9 mounted on socket 11, the friction therebetween will cause the sliding terminal to be urged in a direction generally toward the register causing arm 35 to actuate the one-way ratcheting mechanism and the register.

As in the previously described embodiment, the one-way ratcheting mechanism can also be arranged to actuate the register drum when the sliding terminal is moved in a direction away from the register, such as when the base is moved out of engagement with the socket. Also, the one-way ratcheting mechanism can be arranged to index the register drum half-way between markings upon removal of the meter base from the socket and then upon reinsertion of the base to the socket, to thereby move the next markings on the drum into view in window 16 only upon one complete removal and reinsertion having occurred. An opening 55 is also provided in male terminal 51 proximate base 3 into which a pin 57 may be inserted to temporarily disable the actuation of the register. Opening 55 in male terminal 51 is positioned at a point which is generally even with the surface of the base when male terminal 51 is extended to its fullest extent in a direction away from the register.

Figure 5:
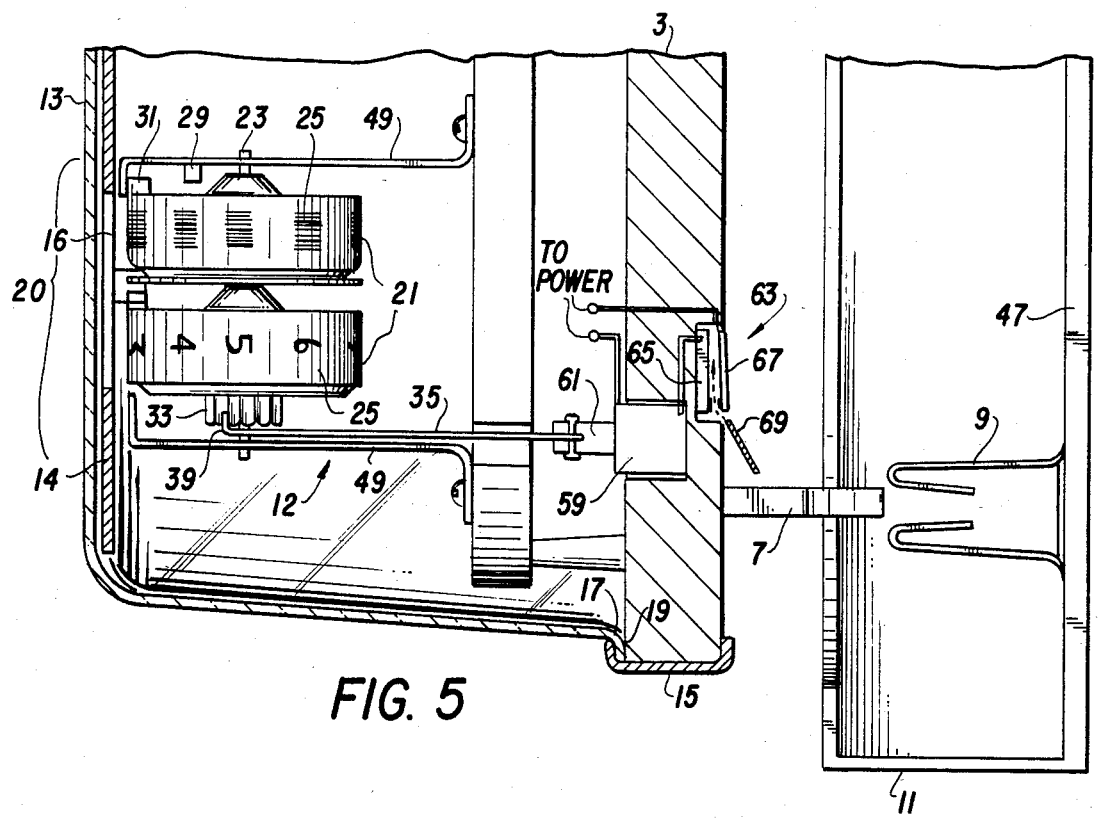
FIG. 5 is a partial top view of a third embodiment of the present invention.

FIG. 5 shows another embodiment utilizing the principles of the present invention. As in FIGS. 2–4 a register 20 having a one-way ratcheting mechanism is mounted within an enclosure 49 attached to the base of a meter. An actuator arm 35 has one end connected to the one-way ratcheting mechanism and its other end connected to a device 59 for electrically driving the ratcheting mechanism of the register, such as a solenoid having a movable armature 61. As shown in FIG. 5, the base of the meter includes a normally-open switch 63 having a pair of contacts 65, 67 positioned such that the contacts are normally open when the base of the meter is not engaging its socket, but which are closed when base 3 engages the surface 47 of socket 11. As shown in FIG. 5, switch 63 and solenoid 59 are connected electrically in series with a source of power, which in an electricity meter can simply be the power being applied from socket receptacles 9 to the two or more terminals 7 which are normally present on the base of the meter.

When base 3 of the meter is not engaging socket 11 switch contacts 65, 67 remain open and no power is applied to solenoid 59. However, when the base of the meter engages with the socket, the switch contacts 65, 67 are closed and power is applied to the solenoid, forcing armature 61 and arm 35 toward the register. This actuates the ratcheting mechanism and causes register drum 21 to rotate and display a new set of markings in window 16.

As shown in FIG. 5, a shim 69, made from a thin piece of insulative material, can be inserted between the normally-open contacts 65, 67 of switch 63 to prevent their closure when base 3 of the meter engages with socket 11. This prevents solenoid 59 from receiving power and the register from being actuated, and thus enables the meter to be tested prior to placing it into operation without actuating the tamper indicating mechanism 12.

Figure 6:
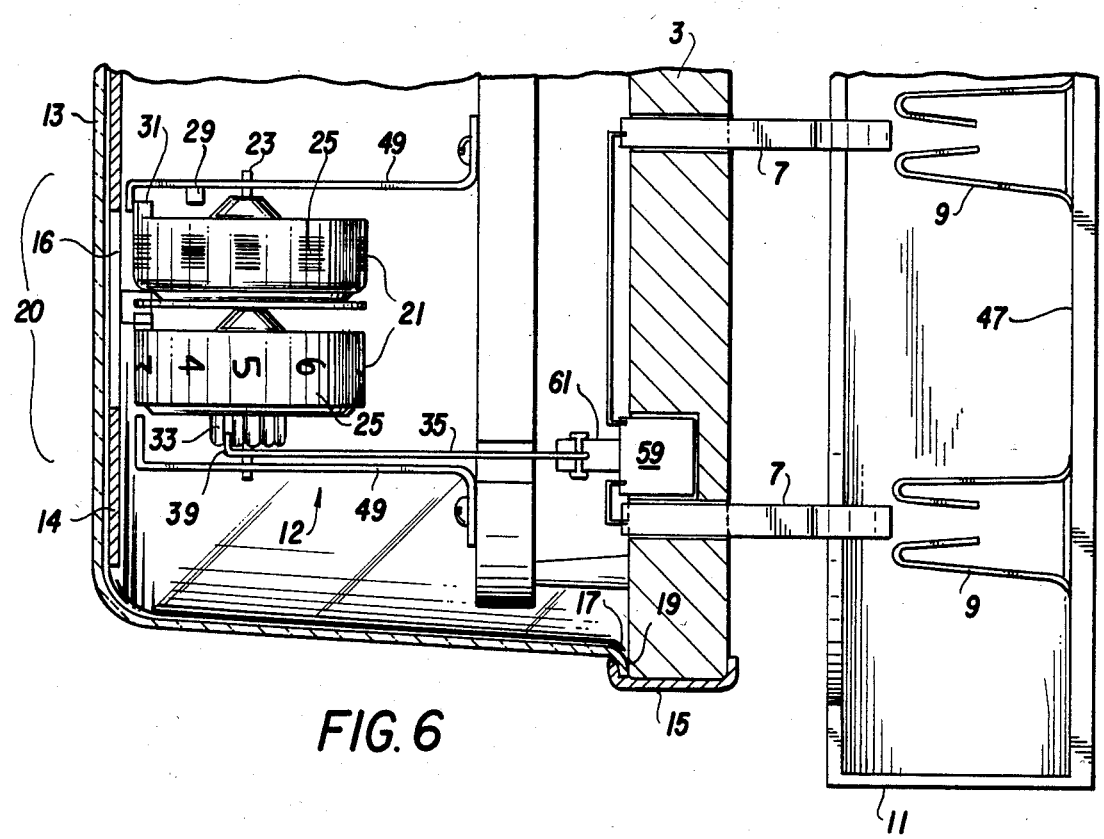
FIG. 6 shows a modified version of the arrangement of FIG. 5.

If desired, the embodiment shown in FIG. 5 can be simplified as shown in FIG. 6 by simply eliminating the switch and having solenoid 59 wired directly in series with the source of power, where the source of power ultimately is provided through socket 11. Thus, when the base of the meter is completely removed from engagement with the socket no power flows through the solenoid; however when the base engages the socket the solenoid is energized and drives the ratcheting mechanism to actuate register drum 21 to display a new set of markings in window 16. Through the choice of an appropriate type of solenoid, the ratcheting mechanism can be actuated either upon the removal of the meter base from the socket or its engagement with the socket; e.g. either upon the loss of energizing power or its reapplication. Further, it is apparent that if the FIG. 5 embodiment is used, the solenoid need not be energized by power supplied via the socket but rather may be internally powered, such as through a battery or charging capacitor (not shown) which is mounted to the meter base. Obviously, other types of switches such as a plunger or "push button" type switch mounted to the base can be used in place of the simple leaf contact type of switch shown in FIGS. 5 and 6. Such a plunger type switch can be used in either a normally open or a normally closed configuration with suitable changes in the power supply arrangement for the solenoid.

While the foregoing invention has been described in considerable detail, it is understood that various modifications and changes will be apparent to one skilled in the art. Accordingly, the foregoing description is intended to be illustrative, but not limitative, of the invention as is described in the following claims.

What is claimed is:

1. In apparatus for measuring a quantity, the measuring apparatus being removably mounted to a socket, means for detecting movement of the measuring apparatus relative to the socket, comprising:
   a unidirectional register mounted to the measuring apparatus, the register capable of displaying at least one of a plurality of markings and arranged to be no longer operative upon displaying a predetermined one of the markings; and
   means for actuating the register having a first portion connected to the register and a second portion engaging the socket, the actuating means being responsive to movement of the measuring apparatus relative to the socket so as to cause the displayed register markings to change to thereby give an indication of such movement.

2. The apparatus of claim 1 wherein the register is a counter and the counter has a maximum reading beyond which it is no longer operative, and wherein the actuating means is responsive to movement of the measuring apparatus relative to the socket to cause the counter to increase its count to thereby give an indication of such movement.

3. The apparatus of claim 1 wherein each register has at least one rotatable drum having a plurality of visually perceptible markings formed thereon.

4. The apparatus of claim 1 further including means for temporarily disabling the register actuating means whereby the measuring apparatus can be moved relative to the socket without causing the displayed register markings to change.

5. The apparatus of claim 1 wherein the register comprises a mechanical cyclometer register and includes a one-way ratcheting mechanism, and the actuating means comprises an arm having a first end engaging the one-way ratcheting mechanism for driving the register and a second end connected to a sliding terminal formed as part of the measuring apparatus, the sliding terminal engaging a fixed terminal mounted on the socket when the measuring apparatus is mounted to the socket.

6. The apparatus of claim 5 further including means for temporarily disabling the register actuating means comprising a pin removably engageable with an opening formed in the sliding terminal whereby the sliding terminal is prevented from moving relative to the measuring apparatus when the pin is in the terminal opening.

7. The apparatus of claim 1 wherein the register comprises a mechanical cyclometer register and includes a one-way ratcheting mechanism, and the actuating means comprises an arm engaging the one-way ratcheting mechanism and a rod having a first end connected to the arm for driving the register and a second end extending beyond the measuring apparatus, the second end of the rod normally being biased into contact with the socket when the measuring apparatus is mounted to the socket.

8. The apparatus of claim 7 further including means for temporarily disabling the register actuating means comprising a pin removably engageable with an opening formed in the second end of the rod whereby the rod is prevented from moving relative to the measuring apparatus when the pin is in the rod opening.

9. The apparatus of claim 1 wherein the actuating means comprises a switch mounted on the measuring apparatus and having contacts responsive to the engagement of the measuring apparatus with the socket, and means responsive to the movement of the switch contacts for electrically driving the register so as to cause the displayed register markings to change.

10. The apparatus of claim 9 wherein the register comprises a mechanical cyclometer register and includes a one-way ratcheting mechanism, and the driving means is a solenoid having its armature connected to the one-way ratcheting mechanism.

11. The apparatus of claim 1 wherein the actuating means comprises means, removably connected to a source of electrical power through the socket and responsive to the engagement of the base with the socket, for electrically driving the register so as to cause the displayed register markings to change.

12. The apparatus of claim 11 wherein the register comprises a mechanical cyclometer register and includes a one-way ratcheting mechanism, and the driving means is a solenoid having its armature connected to the one-way ratcheting mechanism.

13. In apparatus for measuring a billable quantity such as water, gas or electricity, the measuring apparatus being mounted to a base and enclosed by a cover, and the base of the apparatus being removably mounted to a socket,
   means for detecting movement of the base of the measuring apparatus relative to the socket, comprising:
   a unidirectional register mounted to the measuring apparatus, the register having at least one rotatable drum capable of displaying at least one of a plurality of visually perceptible markings and arranged to be no longer operative upon displaying a predetermined one of the markings; and
   an arm having a first end connected to the register and a second end engaging the socket, the arm being arranged so as to cause the markings displayed by the register drum to change upon movement of the measuring apparatus relative to the socket.

14. The apparatus of claim 13 wherein the register comprises a mechanical cyclometer register having a one-way ratcheting mechanism which the first end of the arm engages.

15. The apparatus of claim 13 wherein the second end of the arm is connected to a sliding terminal formed as part of the base of the measuring apparatus, the sliding terminal engaging a fixed terminal mounted on the socket when the measuring apparatus is mounted to the socket.

16. The apparatus of claim 15 further including means for temporarily disabling the register comprising a pin removably engageable with an opening formed in the sliding terminal proximate the base of the measuring apparatus, whereby the sliding terminal is prevented from moving relative to the base when the pin is in the terminal opening.

17. The apparatus of claim 13 wherein the base of the measuring apparatus includes an opening and a rod extending through the opening beyond the base, a first end of the rod connected to the arm and a second end of the rod being biased into contact with the socket when the measuring apparatus is mounted to the socket.

18. The apparatus of claim 17 further including means for temporarily disabling the register comprising a pin removably engageable with an opening formed in the second end of the rod proximate the base of the measuring apparatus, whereby the rod is prevented from moving relative to the base when the pin is in the rod opening.

19. In apparatus for measuring a billable quantity such as water, gas or electricity, the measuring apparatus being mounted to a base and enclosed by a cover, and the base of the apparatus being removably mounted to a socket, means for detecting movement of the base of the measuring apparatus relative to the socket, comprising:

a unidirectional register mounted to the measuring apparatus, the register having at least one rotatable drum capable of displaying at least one of a plurality of visually perceptible markings and arranged to be no longer operative upon displaying a predetermined one of the markings;

a switch mounted on the base and having contacts responsive to the engagement of the base with the socket; and means, responsive to the movement of the switch contacts caused by movement of the measuring apparatus relative to the socket, for electrically driving the register drum to cause the markings displayed by the register drum to change.

20. The apparatus of claim 19 wherein the register comprises a mechanical cyclometer register having a one-way ratcheting mechanism, and wherein the means for driving the register drum comprises a solenoid having its armature connected to the ratcheting mechanism.

21. The apparatus of claim 19 further including means for temporarily disabling the register whereby the base of the measuring apparatus can be moved relative to the socket without causing the markings displayed by the register drum to change.

* * * * *